(12) United States Patent
Suzuki et al.

(10) Patent No.: US 9,584,149 B2
(45) Date of Patent: Feb. 28, 2017

(54) COMPARATOR, AD CONVERTER, AND WIRELESS COMMUNICATION DEVICE

(71) Applicant: KABUSHIKI KAISHA TOSHIBA, Tokyo (JP)

(72) Inventors: Masamichi Suzuki, Tokyo (JP); Yuuichiro Mitani, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/175,606

(22) Filed: Jun. 7, 2016

(65) Prior Publication Data
US 2016/0294406 A1 Oct. 6, 2016

Related U.S. Application Data

(63) Continuation of application No. PCT/JP2014/073701, filed on Sep. 8, 2014.

(30) Foreign Application Priority Data

Dec. 26, 2013 (JP) .................................. 2013-269484

(51) Int. Cl.
*H03M 1/36* (2006.01)
*H03K 5/08* (2006.01)
(Continued)

(52) U.S. Cl.
CPC ................ *H03M 1/36* (2013.01); *H03K 5/08* (2013.01); *H03M 1/18* (2013.01); *H03M 1/361* (2013.01); *H04W 88/02* (2013.01)

(58) Field of Classification Search
CPC .... H03M 1/365; H03M 1/368; H03M 1/1061; H03M 1/0607
(Continued)

(56) References Cited

U.S. PATENT DOCUMENTS 7,265,701 B2 * 9/2007 Ishii ..................... H03M 1/0607
341/155
7,495,592 B1 * 2/2009 Moon ................... H03M 1/368
341/133
(Continued)

FOREIGN PATENT DOCUMENTS

JP 59-132220 7/1984
JP 62-183222 8/1987
(Continued)

OTHER PUBLICATIONS

Yoshioka, K., et al., "A 0.0058mm$^2$7.0 ENOB 24MS/s 17fJ/conv. Threshold Configuring SAR ADC with Source Voltage Shifting and Interpolation Technique", 2013 Symposium on VLSI Circuits Digest of Technical Papers, pp. C266-C267 (2013).
(Continued)

*Primary Examiner* — Lam T Mai
(74) *Attorney, Agent, or Firm* — Finnegan, Henderson, Farabow, Garrett & Dunner LLP

(57) ABSTRACT

According to an embodiment, a comparator includes a first transistor, a second transistor, an output stage, and a node group. The first transistor is configured to operate when a first voltage applied thereto exceeds a first threshold value, and is disposed in an input stage. The second transistor is configured to operate when a second voltage applied thereto exceeds a second threshold value and is disposed in the input stage. The output stage is configured to perform voltage switching and output according to the change in the magnitude relationship between the first voltage and the second voltage. The node group is configured to, during a non-operational state in which the first voltage and the second voltage are not compared, vary at least either the first threshold value or the second threshold value.

9 Claims, 7 Drawing Sheets

(51) Int. Cl.
*H03M 1/18* (2006.01)
*H04W 88/02* (2009.01)

(58) Field of Classification Search
USPC .................................................. 341/130–160
See application file for complete search history.

(56) References Cited

U.S. PATENT DOCUMENTS

| | | | |
|---|---|---|---|
| 8,681,034 B2 | 3/2014 | Marukame et al. | |
| 9,276,597 B1* | 3/2016 | Chang | H03M 1/1023 |
| 2006/0103565 A1* | 5/2006 | Makarem | G01R 31/2884 |
| | | | 341/155 |
| 2014/0055189 A1 | 2/2014 | Suzuki et al. | |
| 2015/0015229 A1* | 1/2015 | Teh | H02M 3/157 |
| | | | 323/284 |

FOREIGN PATENT DOCUMENTS

| | | |
|---|---|---|
| JP | 2003-18008 | 1/2003 |
| JP | 2013-143626 | 7/2013 |
| JP | 5684080 | 3/2015 |
| JP | 5703269 | 4/2015 |

OTHER PUBLICATIONS

International Search Report issued by the Japanese Patent Office in International Application No. PCT/JP2014/073701, mailed Oct. 7, 2014 (8 pages).

\* cited by examiner

COMPARATOR, AD CONVERTER, AND WIRELESS COMMUNICATION DEVICE

CROSS-REFERENCE TO RELATED APPLICATIONS

This application is a continuation of PCT international Application Ser. No. PCT/JP2014/073701, filed on Sep. 8, 2014, which designates the United States; incorporated herein by reference, and which claims the benefit of priority from Japanese Patent Application No. 2013-269484, filed on Dec. 26, 2013; the entire contents of which are incorporated herein by reference.

FIELD

Embodiments described herein relate generally to a comparator, an AD converter, and a wireless communication device.

BACKGROUND

A comparator is one of the derived products of an operational amplifier, and represents an element in which the voltages input to two input terminals thereof are compared, and the output voltage changes according to the magnitude relationship between the two input voltages. When an identical voltage is input to the two input terminals, the output voltage ideally becomes equal to zero. In the case of a CMOS, each input terminal is configured with a MOSFET gate node.

In the conventional technology, it is difficult to enhance the precision of the operations performed by a comparator.

DETAILED DESCRIPTION

Figure 1:
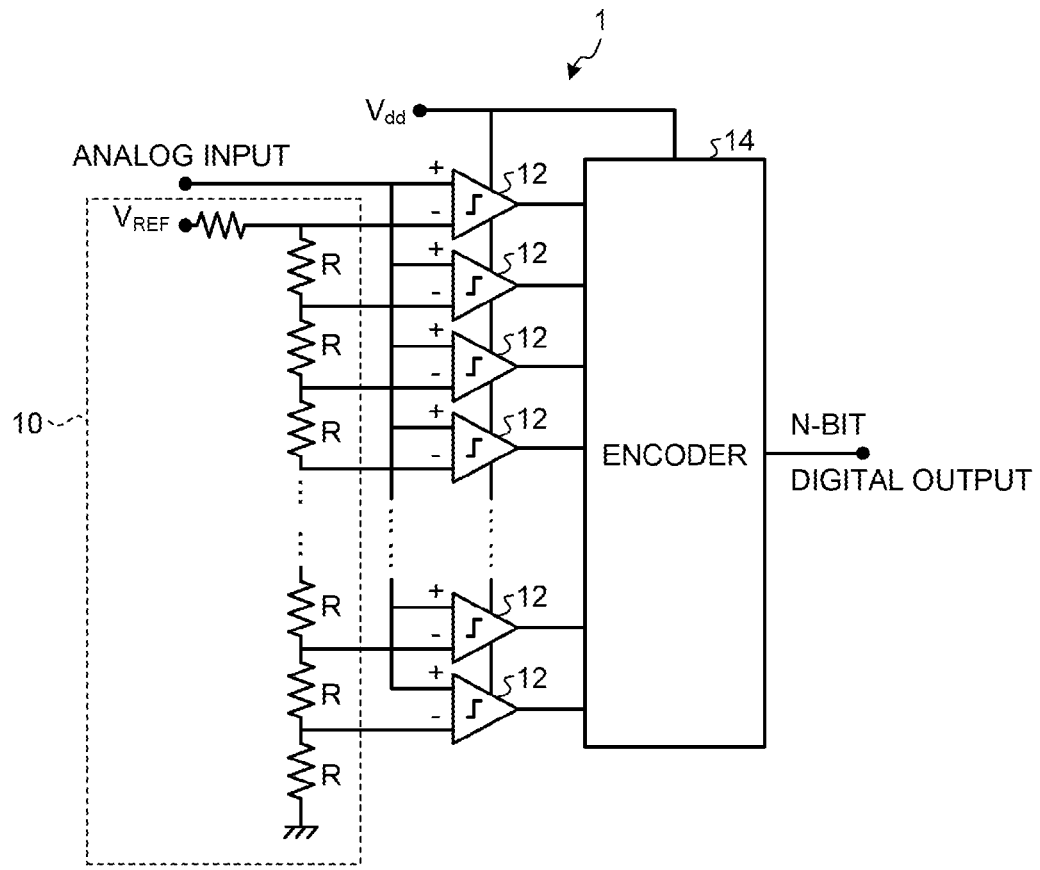
FIG. 1 is a diagram illustrating a configuration of an AD converter of the parallel comparison type.

According to an embodiment, a comparator includes a first transistor, a second transistor, an output stage, and a node group. The first transistor is configured to operate when a first voltage applied thereto exceeds a first threshold value; and is disposed in an input stage. The second transistor is configured to operate when a second voltage applied thereto exceeds a second threshold value and is disposed in the input stage. The output stage is configured to perform voltage switching and output according to the change in the magnitude relationship between the first voltage and the second voltage. The node group is configured to, during a non-operational state in which the first voltage and the second voltage are not compared, vary at least either the first threshold value or the second threshold value.

Firstly, the explanation is given about the background that led to the invention of a comparator and an AD convertor according to an embodiment. In a comparator, in the case in which two MOSFETs constituting two input terminals have variability in the respective threshold voltages, there occurs a voltage difference between the two input terminals for the output of zero. This voltage difference is called an offset voltage.

When the offset voltage is present, the comparator needs to perform comparison using a greater voltage difference than the offset voltage. Thus, the offset voltage represents a crucially important factor in determining the precision of the operations performed by the comparator. Factors for the occurrence of the offset voltage include not only the variability in the threshold voltages. The offset voltage generally includes a systematic offset component and a random offset component. The systematic offset component represents a phenomenon attributed to the design asymmetry among differential pairs and so on. The random offset component represents the offset voltage generated due to process variability such as the variability in the threshold voltages.

Meanwhile, in an AD converter of the parallel comparison type (the flash type) in which a large number of comparators are used; for example, in the case of attempting to obtain N-bit digital data, 2N−1 number of comparison voltages are necessary for dividing the full scale of analog signals into sections equal in number to the N-th power of 2, and 2N−1 number of comparators are also necessary. As a result, an AD converter of the parallel comparison type can perform quantization in a single clock and output a thermometer code, and further can encode the thermometer code and output digital data. Hence, an AD converter of the parallel comparison type has the characteristic of being the fastest operating converter as far as the AD conversion method is concerned.

On the other hand, in an AD converter of the parallel comparison type, the conversion accuracy is determined according to the precision of the resistance values in a resistor ladder and according to the resolution (particularly the offset voltage) of the comparators. The voltage dividing precision of the resistor ladder is dependent on the precision of the semiconductor microfabrication technology. As a method of avoiding variability in the resistance values of the resistor ladder, a method (the laser trimming method) is known in which resistive fuses (variable resistances) are fabricated along with the resistor ladder and, after the AD converter is manufactured, unnecessary resistive fuses are burnt out one by one using laser irradiation, so that the resistance values are adjusted before shipping the AD converter. However, in this method, the higher the resolution of the AD converter, the greater the increase in the size of the circuit scale. Thus, in the case in which the AD converter is connected to other circuits as an SOC (system-on-chip), it becomes difficult to adjust the resistance values one by one.

Thus, the resolution of an AD converter becomes restricted within the limit of accuracy of the semiconductor microfabrication technology. Moreover, once the resistive fuses in an AD converter are burnt off, it becomes impossible to adjust the resistance values thereafter. Hence, it is difficult to sufficiently enhance the voltage dividing accuracy of the resistor ladder. Moreover, in order to compensate for the offset voltages of the comparators, it becomes necessary to have a compensation circuit. That is disadvantageous from the perspective of the chip area and the power consumption.

FIG. 1 is a diagram illustrating a configuration of an AD converter 1 of the parallel comparison type. As illustrated in FIG. 1, the AD converter 1 includes a voltage generating unit 10, a plurality of comparators 12, and an encoder 14.

The voltage generating unit 10 includes a plurality of resistances R connected in series (a resistor ladder). The voltage generating unit 10 divides a reference voltage $V_{REF}$, which is applied from outside, using the resistor ladder; and generates a plurality of different comparison voltages. Each comparison voltage generated by the voltage generating unit 10 is input to the corresponding comparator 12. Moreover, each comparator 12 receives a common analog input (input voltage). Thus, each comparator 12 compares the comparison voltage input thereto with the analog input voltage, and outputs a digital signal according to the comparison result to the encoder 14. Then, the encoder 14 encodes the digital signal output from each comparator 12 and outputs the resultant digital value.

In FIG. 1, AD converter 1 is illustrated as having a plurality of resistors R and a plurality of comparators 12. Herein, the greater the number of the resistors R and the comparators 12, the more enhanced the resolution becomes. From the perspective of enhancing the conversion precision of the AD converter, it is desirable that the AD converter have a resolution equal to or greater than 10 bits. However, for the purpose of illustration, the explanation is given for an example in which an AD converter has a low-bit resolution.

Figure 2:
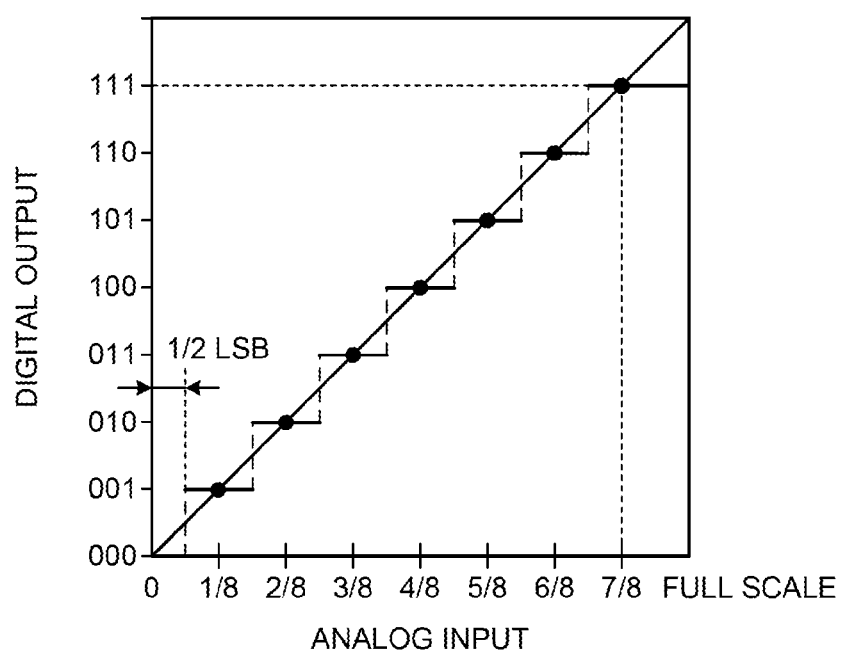
FIG. 2 is a graph illustrating an example of the input-output characteristic of the AD converter.

As far as the output values from the AD converter 1 (i.e., the digital values obtained by conversion) are concerned; for example, such values are read which are obtained by evenly dividing the bits between the reference voltage $V_{REF}$ and GND (256 divisions in the case of 8 bits, or 1024 levels in the case of 10 bits) and then converting the result into integers. Meanwhile, as the reference voltage, there is a case in which "$V_{REF}$" is applied and there is a case in which "$\pm V_{REF}$" is applied. In the case in which "$V_{REF}$" is applied, the value obtained by dividing "$V_{REF}$" by 2N (i.e., $V_{REF}/2N$) (where N is the bit count of the output value) is equivalent (meanwhile, in the case in which "$\pm V_{REF}$" is applied, $2V_{REF}/2N$ is equivalent) to the height of one step of the input-output characteristics of a staircase pattern illustrated in FIG. 2. In this case, the number of steps is equal to one step less than the N-th power of 2.

If the resolution is set to 3 bits, the analog input voltage is divided into eight divisions (i.e. the cube of 2), the number of steps becomes equal to seven, and the voltage level at each step is output as a digital value including zero voltage. If the minimum unit of voltage is treated as the LSB (Least Significant Bit), then only the lowermost bit has the range equivalent to half of the LSB. Meanwhile, the LSB originally represents the lowermost digit of binary digits. In contrast, the uppermost digit of binary digits is called the MSB (Most Significant Bit). In AD converter 1, the analog input voltage is compared with the voltages obtained by dividing the reference voltage $V_{REF}$ using the resistor ladder; and the resultant thermometer code serving as the converter output is again converted into a binary code by the encoder 14 before being (digitally) output.

Herein, the precision of the AD converter 1 depends to on the precision of voltage comparison performed by each comparator 12. In the case of an AD converter having an 8-bit resolution, if the resistor ladder is applied with $\pm V_{REF}=\pm 0.5$ V, then the interval between the comparison voltages retrieved from the resistor ladder is equal to a small value of about 4 mV. That is, the maximum value of the voltage error in the steps needs to be held down to be equal to or smaller than 2 mV (½LSB). Besides, also regarding the reference voltage $V_{REF}$ that is generated by a bandgap reference power source generally used as the reference power source, an identical high level of precision needs to be ensured.

Moreover, as described earlier, the precision of the comparators 12 is greatly affected by the offset voltage of the input terminals and by the offset voltage dependent on the circuit layout. In this way, the performance of an AD converter of the parallel comparison type is determined according to the precision of the input voltage, the precision of the reference voltage, and the offset voltages of the comparators.

Embodiment

Figure 3:
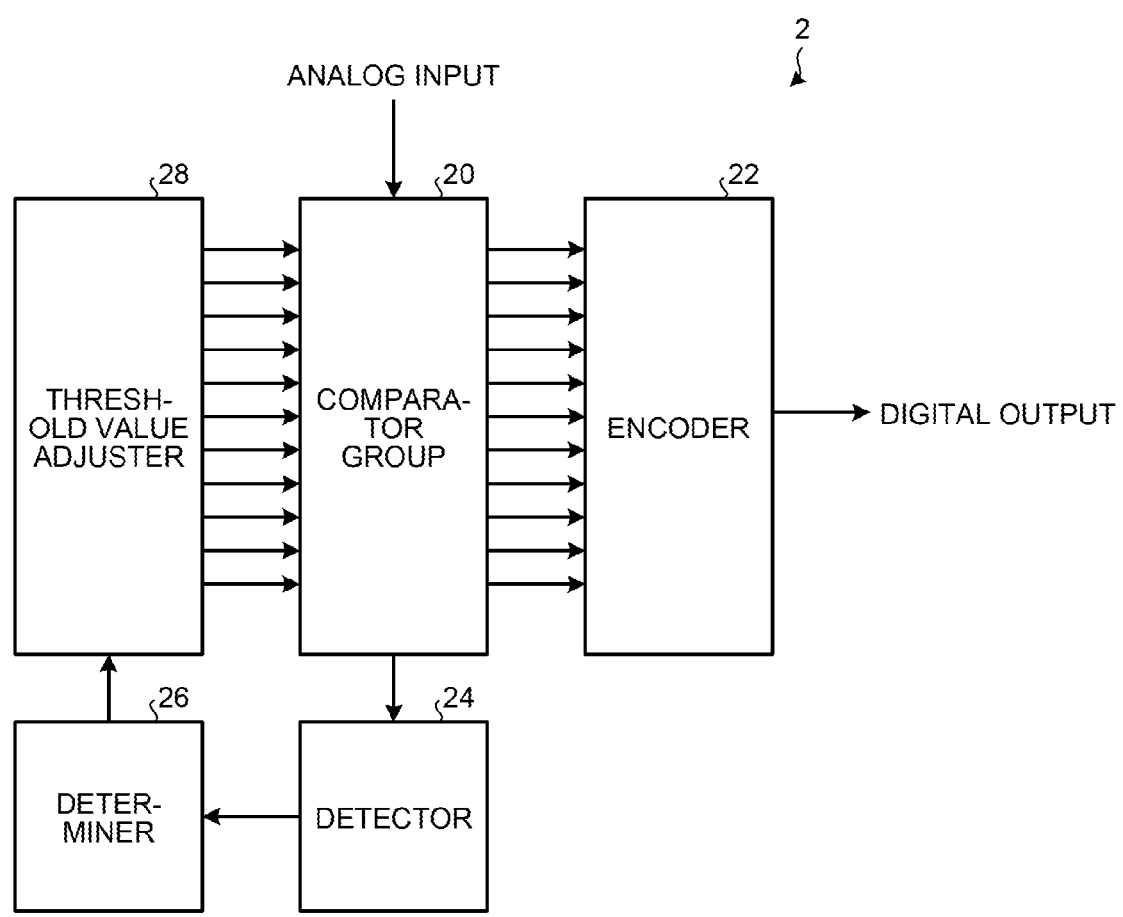
FIG. 3 is a block diagram illustrating a configuration of an AD converter according to an embodiment that is of the parallel comparison type and that includes comparators.

Given below is the explanation of an AD converter according to the embodiment that is of the parallel comparison type and that includes comparators. FIG. 3 is a block diagram illustrating a configuration of an AD converter 2 according to the embodiment that is of the parallel comparison type and that includes comparators. As illustrated in FIG. 3, the AD converter 2 includes a comparator group 20, an encoder 22, a detector 24, a determiner 26, and a threshold value adjuster 28. Thus, in the AD converter 2, a circuit equivalent to the voltage generating unit 10 illustrated in FIG. 1 is not required. Meanwhile, alternatively, the AD converter 2 can be configured to not include the detector 24, the determiner 26 and the threshold value adjuster 28. Moreover, a standalone comparator can be configured that includes the detector 24, the determiner 26 and the threshold value adjuster 28.

Firstly, the explanation is given about a brief overview of the AD converter 2. The comparator group 20 includes 2N−1 number of comparators 3 according to the embodiment (described later with reference to FIG. 4). Herein, N represents the number of bits of the digital data output by the AD converter 2.

The encoder 22 includes a logic circuit (not illustrated) for receiving the 2N−1 number of comparison results output by the comparator group 20; encodes the comparison results output by the comparator group 20; and outputs the encoded comparison results.

The detector 24 detects the 2N−1 number of comparison results (voltage switching) output by the comparators 3 of the comparator group 20, and outputs the comparison results to the determiner 26.

The determiner 26 determines whether or not each comparison result detected by the detector 24 represents a predetermined setting operation. If each comparison result detected by the detector 24 does not represent a predetermined setting operation, then the determiner 26 outputs, to the threshold value adjuster 28, the necessary adjustment amount to ensure that each comparator 3 performs the setting operation (for example, outputs the writing period required to adapt to the setting).

According to the necessary adjustment amount received from the determiner 26, the threshold value adjuster 28 adjusts the threshold value (described later) of each comparator 3 in the comparator group 20. For example, when the absolute value of the difference between the two voltages (input voltages) input to the comparator 3 becomes equal to or smaller than predetermined setting value, the threshold value adjuster 28 applies a voltage to each node group (described later) of the comparator 3 in such a way that the voltage value output by the comparator 3 is equal to or smaller than another predetermined setting value, and adjusts the threshold value of at least one of the transistors to which the input terminals (the input nodes) of the comparator 3 are connected.

Figure 4:
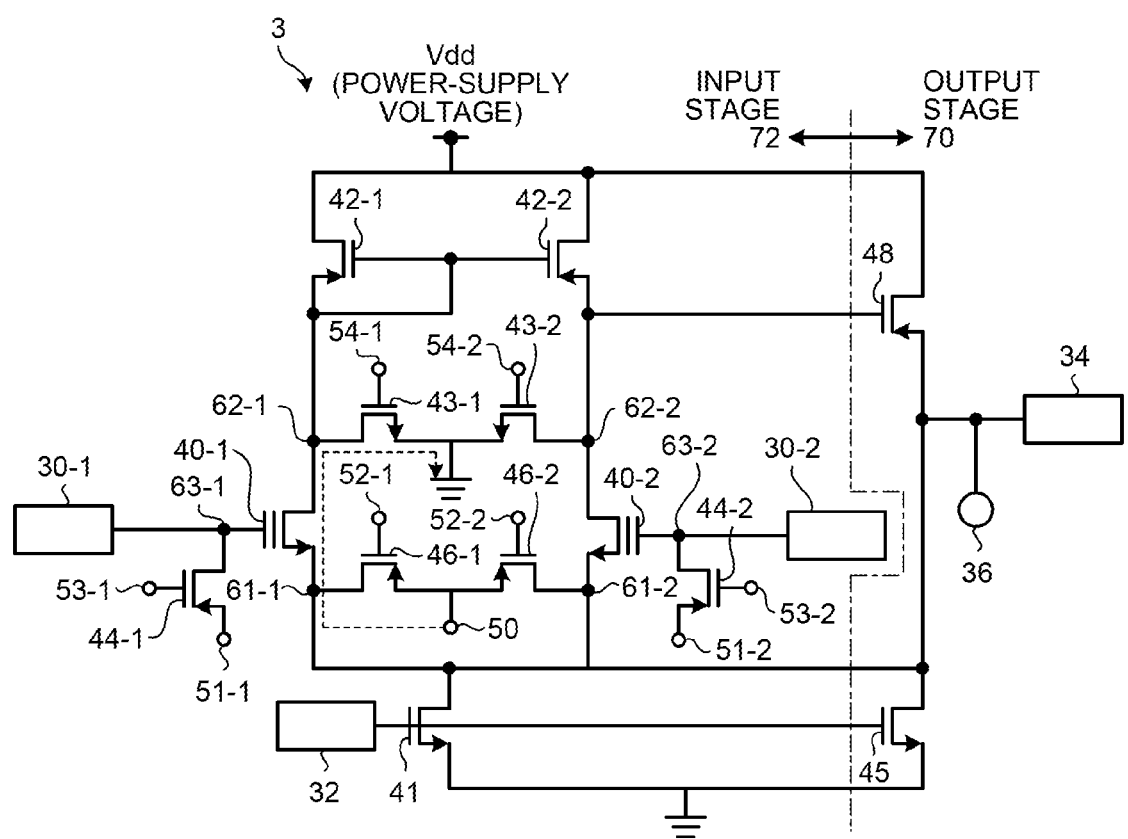
FIG. 4 is a diagram illustrating a configuration of the comparator according to the embodiment.

Given below is the detailed explanation of each constituent element of the AD converter 2. Firstly, the explanation is given about the comparator 3. FIG. 4 is a diagram illustrating a configuration of the comparator 3. As illustrated in FIG. 4, the comparator 3 includes input nodes 30-1 and 30-2, a constant current node 32, an output node 34, and a monitor node 36. Meanwhile, alternatively, the output node 34 can be configured to have the functions of the monitor node 36 too. In the following explanation, when one of a plurality of same constituent elements, such as the input nodes 30-1 and 30-2, is referred to without distinction, then simply the term "input node 30" is used.

The comparator 3 compares two analog signals that are input (i.e., compares two input voltages that are applied) to the input nodes 30-1 and 30-2; and outputs, from the output node 34, an output voltage that changes according to the change in the magnitude relationship between the two input signals. The constant current node 32 is applied with a constant voltage for the purpose of constituting a constant current source. The monitor node 36 monitors the voltage output from the output node 34. Particularly, the monitor node 36 is used in detecting the offset voltage of the comparator 3.

The input node 30-1 is connected to the gate of a transistor (memory transistor) 40-1, while the input node 30-2 is connected to the gate of a transistor (memory transistor) 40-2.

Transistor 40 is, for example, a SONOS (Silicon Oxide Nitride Oxide Semiconductor) transistor of the charge accumulation type in which a charge accumulation layer is present. A SONOS transistor (SONOS) has the function of accumulating the electrical charge in a trap inside a nitride film (the charge accumulation layer) that serves as an insulation film, and retaining the memory. In a SONOS, a threshold voltage (threshold value) $V_{th}$ changes according to the amount of electrical charge accumulated in the charge accumulation layer and, when the amount of electrical charge is retained, the threshold voltage $V_{th}$ is also retained. Meanwhile, transistor 40 can alternatively be a MONOS (Metal Oxide Nitride Oxide Semiconductor) or a transistor used in a flash memory of the floating gate (FG) type.

Thus, in each comparator 3 in the AD converter 2, the threshold values for the transistors 40-1 and 40-2 can be individually set. Hence, regardless of whether an identical voltage is applied to the input nodes 30-1 and 30-2 or whether different voltages are applied to the input nodes 30-1 and 30-2, the comparator 3 can be set to perform the operation of switching the output voltage. In each comparator 3 in the AD converter 2, for example, an identical voltage (analog input) is applied to the input nodes 30-1 and 30-2.

Moreover, in each comparator 3, the threshold value of the transistor 40-1 (or the transistor 40-2) is adjusted to sequentially differ at regular intervals, and the input node 30 that is connected to the post-adjustment transistor 40 happens to be the node applied with the reference voltage $V_{REF}$ used in AD conversion. That is, in the AD converter 2, as a result of adjusting the threshold value of the transistor 40 in each comparator 3, even if the voltage generating unit 10 illustrated in FIG. 1 is not disposed, AD conversion can be performed in an identical manner to the case in which the voltage generating unit 10 is disposed.

The constant current node 32 is connected to the gate of an nMOS transistor 41. Moreover, in the comparator 3, pMOS transistors 42-1 and 42-2 are disposed at the power supply side of the transistors 40-1 and 40-2. The pMOS transistors 42-1 and 42-2 constitute a current mirror circuit.

Moreover, the comparator 3 includes nMOS transistors 43-1, 43-2, and 45; as well as includes pMOS transistors 44-1, 44-2, 46-1, 46-2, and 48.

Furthermore, the comparator 3 includes nodes 50, 51-1 to 54-1, and 51-2 to 54-2 that are connectible to other circuits; as well as includes internal nodes 61-1 to 63-1 and 61-2 to 63-2. For example, regarding the nodes 50, 51-1 to 54-1, and 51-2 to 54-2; the electrical potential is arbitrarily variable ranging from the power-supply voltage to the ground voltage under the control of another circuit. Moreover, regarding the nodes 50, 51-1 to 54-1, and 51-2 to 54-2; electrical potentials during writing operations can be set to be different than electrical potentials during circuit operations.

The nMOS transistor 43 has the gate terminal thereof connected with the node 54, and has the drain terminal thereof connected with a node 62 that is positioned in between the transistors 40 and 42.

The pMOS transistor 44 has the gate terminal thereof connected with the node 53 and, when a power-supply voltage is applied to the node 51, has the drain terminal thereof connected with the gate terminal of the transistor 40 (and the input node 30) and the node 63.

The pMOS transistor 46 has the gate terminal thereof connected to the node 52 and, when a power-supply voltage is applied to the node 50, has the drain terminal thereof connected with the drain terminal of the nMOS transistor 41 and the node 61.

In the comparator 3; the nMOS transistor 45, the pMOS transistor 48, the output node 34, and the monitor node 36 constitute an output stage 70; while the other transistors and nodes constitute an input stage 72.

Given below is the explanation of an example of a writing (electrical load accumulation: threshold voltage adjustment) operation performed in the AD converter 2 with respect to the transistor 40. Herein, the explanation is given about the writing performed with respect to the transistor 40-1. However, the writing with respect to the transistor 40-2 can also be performed in an identical manner.

When the power-supply voltage (for example, 3.3 V) is applied to the node 50 and when the node 52-1 is set to 0 V, the pMOS transistor 46 is switched ON and the electrical potential of the node 61-1 becomes equal to the power-supply voltage. Moreover, when the power power-supply voltage is applied to the node 54-1, the nMOS transistor 43-1 is switched ON and the electrical potential of the node 62-1 becomes grounded.

In this state, when the power-supply voltage is applied to the node 51-1 and when the node 53-1 is set to 0 V, the pMOS transistor 44-1 is switched ON and a voltage equal to the power-supply voltage is applied to the gate terminal of the transistor 40-1. The direction of the electrical current at that time is illustrated using a dashed arrow.

When the transistor 40 operates in this way, on the drain side of the transistor 40 (on the side of the node 61-1), a hot carrier is generated due to impact ionization, electrons get trapped in the charge accumulation layer of the transistor 40, and the threshold voltage $V_{th}$ undergoes a change. At that time, as long as the voltage applied to the gate terminal of the transistor 40 is equal to or smaller than the power-supply voltage, it serves the purpose. Thus, the voltage can be suitably varied in order to let impact ionization occur in an efficient manner.

The detector 24 detects, from each comparator 3 in the comparator group 20, the offset voltage via the corresponding monitor node 36. The determiner 26 determines whether or not each comparison result (voltage switching) detected by the detector 24 is the same as the predetermined setting operation (voltage switching). If each comparison result detected by the detector 24 is not the same as the predetermined setting operation, then the determiner 26 outputs, to the threshold value adjuster 28, the necessary adjustment amount for ensuring that each comparator 3 performs the setting operation. According to the necessary adjustment amount received from the determiner 26, the threshold value adjuster 28 adjusts the threshold value (the threshold voltage $V_{th}$) of each comparator 3 in the comparator group 20.

More particularly, according to the necessary adjustment amount received from the determiner 26, the threshold value adjuster 28 varies the threshold voltage $V_{th}$ of the transistor 40 in each comparator 3; and then the detector 24 again detects the offset voltage. Herein, the threshold value adjuster 28 adjusts the threshold value of the transistor 40 of each comparator 3 until the predetermined offset voltage is detected in that comparator 3.

Figure 7:
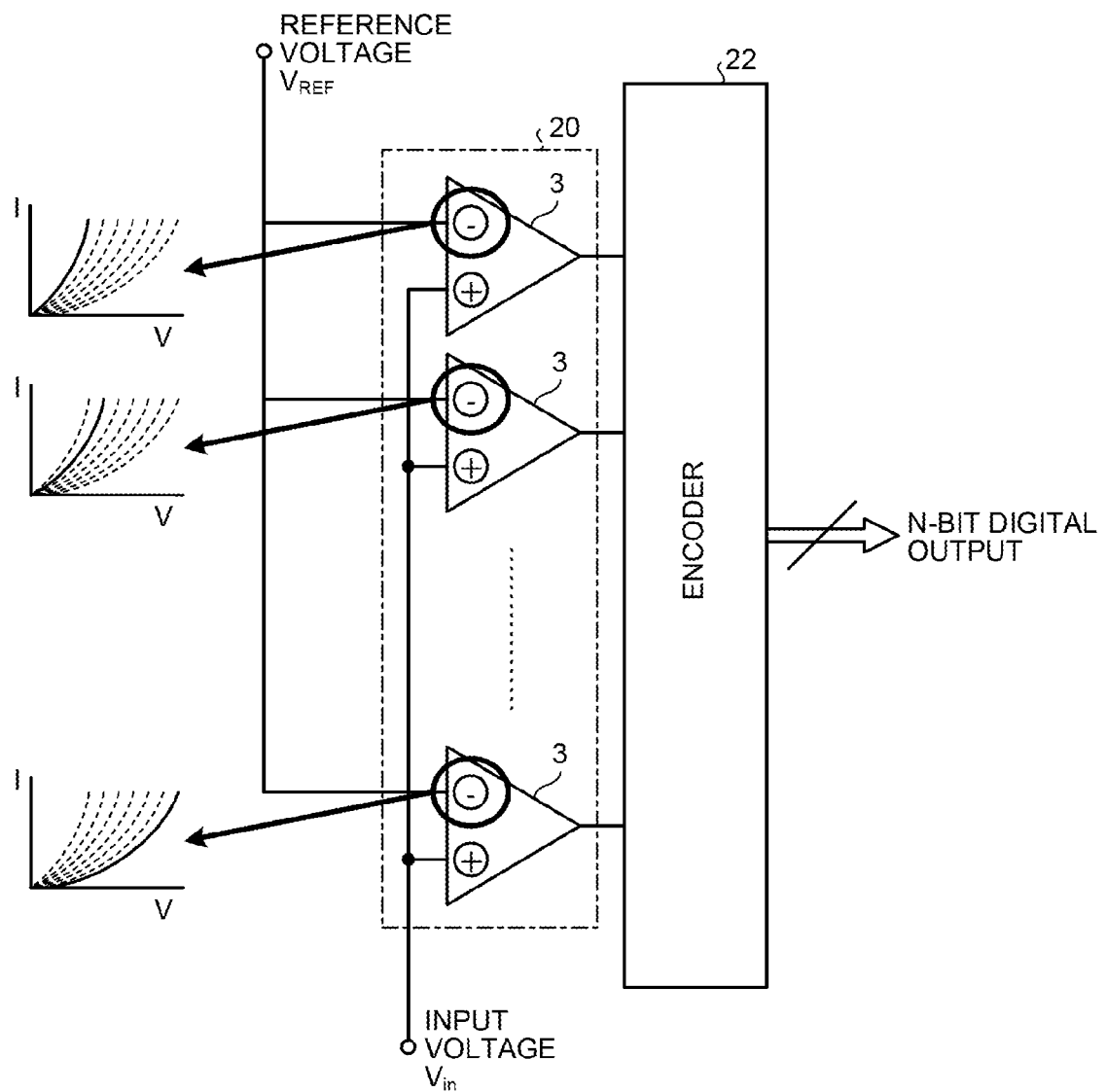
FIG. 7 is a diagram illustrating a modification example of the comparator group and the encoder.

Thus, the AD converter 2 applies a voltage to a plurality of nodes (the node group) in each comparator 3, and adjusts the threshold value of the transistor 40-1 in each comparator 3 or the threshold value of the transistor 40-2 in each comparator 3 to sequentially differ at regular intervals (see FIG. 7).

Meanwhile, if the AD converter 2 does not include the detector 24, the determiner 26, and the threshold value adjuster 28; then the operations that would be performed by the detector 24, the determiner 26, and the threshold value adjuster 28 with respect to the comparator group 20 (each comparator 3) can be performed from outside.

As described above, the threshold voltage $V_{th}$ changes according to the amount of electrical charge accumulated in the charge accumulation layer of the transistor 40 and, when the amount of electrical charge is retained, the threshold voltage $V_{th}$ is also retained. Thus, when the comparator 3 operates after the threshold voltage $V_{th}$ has been adjusted, the nodes 61, 62, and 63 have such electrical potentials set therein that no writing is performed in the charge accumulation layer of the transistor 40. For example, with respect to the transistor 40; 0 V is set in the source node, 0.1 V is set in the drain node, and 0.8 V is set in the gate node.

Figure 5A:
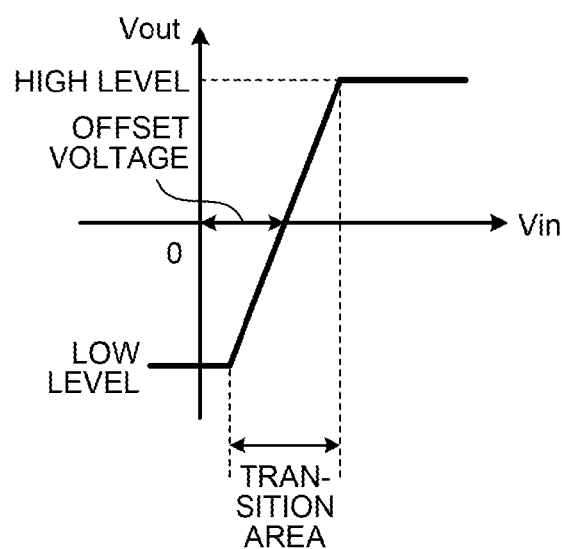
FIGS. 5A and 5B are graphs illustrating a pre-adjustment state and a post-adjustment state of offset voltage, respectively.
Figure 5B:
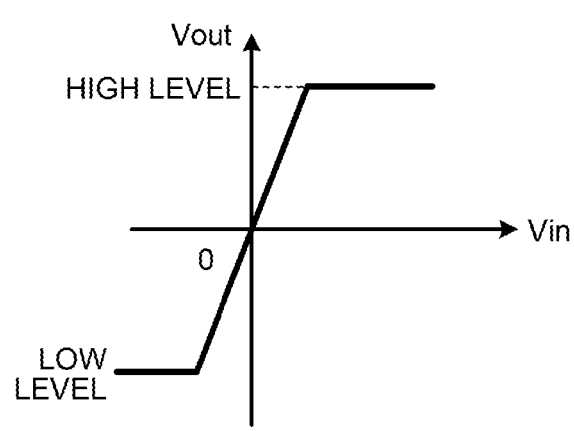

Given below is the detailed explanation about an example of operations performed by the threshold value adjuster 28 to adjust the offset voltage of each comparator. FIG. 5 is a graph illustrating a pre-adjustment state (a) and a post-adjustment state (b) of the offset voltage.

Firstly, with respect to a single comparator 3 (FIG. 4) serving as the reference comparator in the comparator group 20, the threshold value adjuster 28 (FIG. 3) fixes the voltage of the gate of the transistor 40-1, for example. Then, to the gate of the transistor 40-2, the threshold value adjuster 28 applies a voltage that is swept within an arbitrary range including the voltage applied to the transistor 40-1. Herein, the difference between the voltage values applied to the transistors 40-1 and 40-2 is defined as $V_{in}$.

While sweeping the voltage applied to the transistor 40-2, the threshold value adjuster 28 performs writing in, for example, the transistor 40-2 and adjusts the threshold value thereof according to the adjustment amount that is output by the determiner 26 after performing determination with respect to the offset voltage detected by the detector 24 via the monitor node 36. That is, the threshold value adjuster 28 performs writing in the transistor 40 in such a way that the offset voltage detected by the detector 24 becomes equal to or smaller than a predetermined setting value (such as a value substantially equal to zero) (i.e., in such a way that the state illustrated in FIG. 5A changes to the state illustrated in FIG. 5B).

Herein, for example, simultaneous to the application of the power-supply voltage to the gates of the pMOS transistors 44-2 and 46-2, the power-supply voltage is applied to the source of the pMOS transistor 46-2 and to the gate of the pMOS transistor 42-2. In this environment, the transistor 40-2 has the power-supply voltage applied to the gate and the drain thereof, and writing is performed as a result of infusion of a hot carrier in the charge accumulation layer in the SONOS; so that the threshold voltage shifts toward the positive direction. The threshold value adjuster 28 can determine the amount of the hot carrier to be infused in the charge accumulation layer of the transistor 40 by adjusting the timing of applying the voltage to the gate and the drain of the transistor 40-2; and thus can fine-tune the threshold voltage.

At that time, the threshold value is appropriately determined according to the analog signal (the input voltage) that is input to each comparator 3. In this way, in the AD converter 2, since the threshold value adjuster 28 adjusts the threshold value according to the offset voltage detected by the detector 24, it becomes possible to prevent a decline in the accuracy attributed to the systematic offset component as well as the random offset component.

Figure 6:
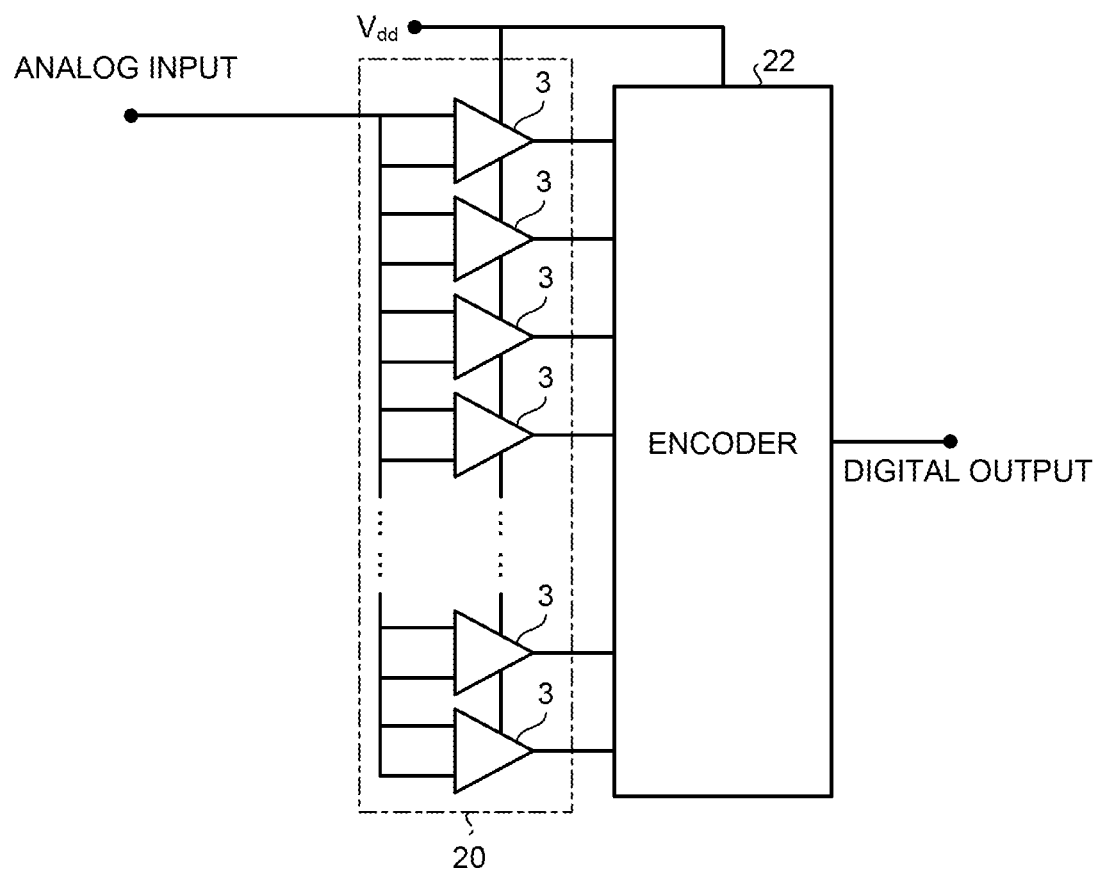
FIG. 6 is a diagram illustrating a comparator group and an encoder in the AD converter according to the embodiment.

Given below is the explanation of the comparator group 20 and the encoder 22 in the AD converter 2. FIG. 6 is a diagram illustrating the comparator group 20 and the encoder 22 in the AD converter 2. Meanwhile, the AD converter 2 may not include the detector 24, the determiner 26, and the threshold value adjuster 28 illustrated, but may include the comparator group 20 and the encoder 22; and writing can be performed under external control equivalent to the detector 24, the determiner 26, and the threshold value adjuster 28.

As illustrated in FIG. 6, the comparator group 20 includes a plurality of comparators 3. In each comparator 3, an analog signal (an input voltage) to be subjected to AD conversion is input to each of the two input nodes (i.e., the input nodes 30-1 and 30-2). In the comparator group 20, the threshold value of the transistor 40-2 (or the transistor 40-1) in each comparator 3 is adjusted to sequentially differ at regular intervals.

More particularly, after the offset voltage of the reference comparator 3 is adjusted to, for example, zero; writing is performed with respect to the transistor 40-2 in the comparators 3 other than the reference comparator 3 (in the following explanation, the reference comparator 3 is assumed to be the uppermost comparator 3 illustrated in FIG. 6). At that time, if the AD converter 2 is an N-bit converter, the total number of the comparators 3 is equal to 2N−1. Thus, the comparators 3 other than the reference comparator 3 are equal in number to 2N−2.

For example, the threshold value adjuster 28 performs writing in an accurate manner with respect to the transistor 40-2 of the comparator 3 that, from among the 2N−2 number of comparators 3 present on the lower side of the reference comparator 3, is closest to the reference comparator 3, so that the offset voltage is shifted in the positive direction by one LSB, that is, by $V_{REF}/(2N-1)$. At that time, the threshold value adjuster 28 performs predetermined writing with respect to the concerned comparator 3 based on the offset voltage detected by the detector 24.

Subsequently, the threshold value adjuster 28 performs writing with respect to the transistor 40-2 of each remaining comparator 3 in an identical manner, so that the offset voltage is shifted by one LSB. Thus, in the comparator group 20, when an analog signal to be subjected to AD conversion is commonly input to all input nodes (i.e., the input nodes 30-1 and 30-2) of all comparators 3, a thermometer code corresponding to the analog signal is output (even if the reference voltage $V_{REF}$ is not available). The encoder 22 encodes the thermometer code output by the comparator group 20, and performs digital output thereof. In this way, even if a perfect comparison voltage generating unit (a resistor ladder) with no variability is not disposed, the AD converter 2 is capable of performing an output equivalent to the case in which a comparison voltage generating unit is disposed.

Modification Example

FIG. 7 is a diagram illustrating a modification example of the comparator group 20 and the encoder 22 illustrated in FIG. 6. As illustrated in FIG. 7, in the comparator group 20, the comparators 3 can be connected in such a way that the reference voltage $V_{REF}$ is commonly input to the negative input terminal (for example, the input node 30-2) of each comparator 3, and the input voltage $V_{in}$ is commonly input to the positive input terminal (for example, the input node 30-1) of each comparator 3.

Herein too, in an identical manner to the comparator group 20 described above, for example, the threshold value of the transistor 40-2 (or the transistor 40-1) in each comparator 3 is adjusted to sequentially differ at regular intervals. In FIG. 7 is schematically illustrated the I-V characteristic (drain current-gate voltage characteristic) of the transistor 40-2 in each comparator 3.

As described earlier, in the AD converter 2, the offset voltage of each comparator 3 is detected and it is determined whether or not each offset voltage is within a predetermined setting range. In the comparator 3 in which the offset voltage is not within the predetermined setting range, writing is performed in a repeated manner until the offset voltage falls within the setting range. In the AD converter 2, after each comparator 3 has the set offset voltage, the comparator group 20 receives input of analog values, performs a comparison operation, and outputs the result to the encoder 22.

Figure 8:
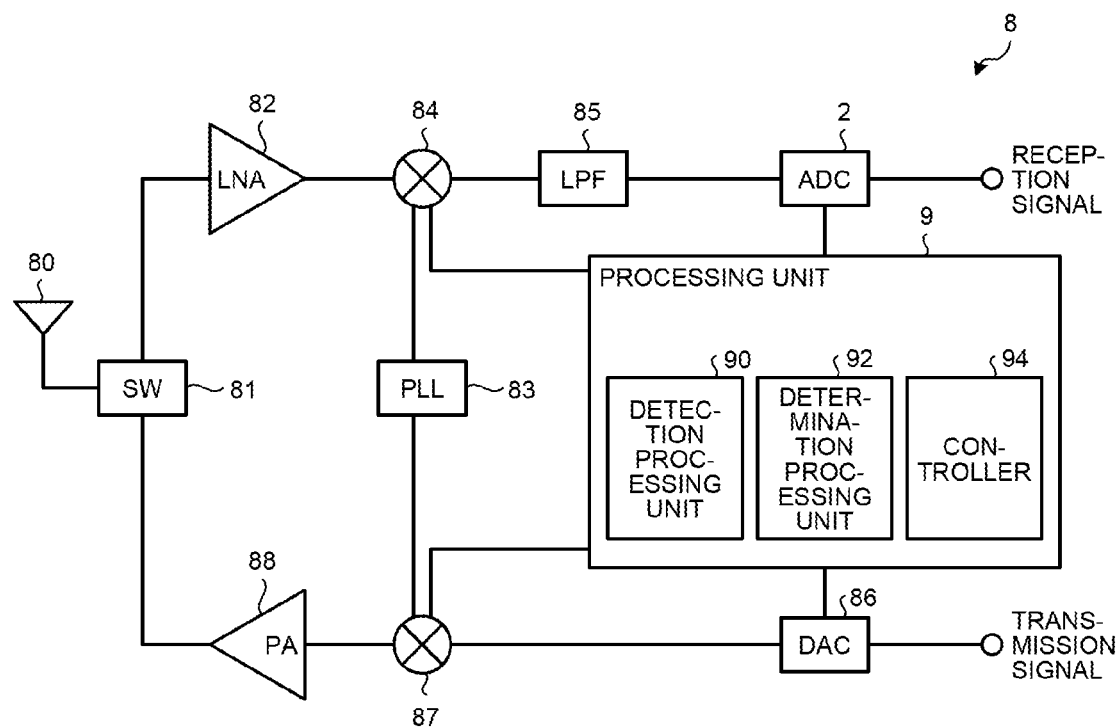
FIG. 8 is a diagram illustrating a configuration of a wireless communication device that includes the AD converter according to the embodiment.

Given below is the explanation of a wireless communication device 8 that includes the AD converter 2. FIG. 8 is a diagram illustrating a brief overview of a configuration of the wireless communication device 8 of the direct conversion type that includes the AD converter 2. As illustrated in FIG. 8, the wireless communication device 8 includes an antenna 80, a switch 81, a low noise amplifier (LNA) 82, a PLL (Phase Locked Loop) 83, two mixer circuits 84 and 87, a low pass filter (LPF) 85, the AD converter (ADC) 2, a DA converter (DAC) 86, a power amplifier (PA) 88, and a processing unit 9.

The switch 81, the LNA 82, the PLL 83, the two mixer circuits 84 and 87, the LPF 85, the AD converter (ADC) 2, the DA converter 86, the PA 88, and the processing unit 9 either can be configured using individual chips or can be arbitrarily combined in a single chip.

The antenna 80 receives radio waves formed by superimposing signals on carrier waves. The switch 81 performs switching between a receiving circuit including the LNA 82 and a transmitting circuit including the PA 88. The LNA 82 amplifies the signals (RF signals) received by the antenna 80, and outputs the amplified signals to the mixer circuits 84.

The PLL 83 includes a VCO (Voltage Controlled Oscillator), performs phase synchronization with respect to the signals (local signals LO) having the same frequency as the carrier waves, and outputs phase-coherent signals to the mixer circuits 84 and 87.

The mixer circuit 84 included in the receiving circuit mixes the local signals LO output by the PLL 83 with the RF signals output by the LNA 82, and outputs the mixed signals to the LPF 85. The mixer circuit 87 included in the transmitting circuit mixes the local signals LO output by the PLL 83 with transmission signals output by the DA converter 86, and outputs the mixed signals to the PA 88. As far as the mixer circuits 84 and 87 are concerned, it is possible to use transistors that are capable of adjusting the threshold voltage $V_{th}$.

The LPF 85 receives the reception signals from the mixer circuit 84 and lets low-pass signals pass through. The AD converter 2 performs AD conversion with respect to those signals. Herein, the explanation is given for the case in which the AD converter 2 includes the detector 24, the determiner 26, and the threshold value adjuster 28. However, alternatively, the AD converter 2 may not include the detector 24, the determiner 26, and the threshold value adjuster 28; and the threshold value in each comparator 3 can be adjusted by the processing unit 9.

The DA converter 86 performs DA conversion with respect to the transmission signals and outputs the resultant signals to the mixer circuit 87 of the transmitting circuit. The PA 88 amplifies the transmission signals. Meanwhile, as far as the DA converter 86 is concerned, it is possible to use a transistor capable of adjusting the threshold voltage $V_{th}$.

The processing unit 9 includes a detection processing unit 90, a determination processing unit 92, and a controller 94. When the two mixer circuits 84 and 87 and the DA converter 86 include a transistor capable of adjusting the threshold voltage $V_{th}$ or when the AD converter 2 does not include the detector 24, the determiner 26, and the threshold value adjuster 28; the detection processing unit 90 detects the gate voltage, the drain current, and the substrate current at the time of writing performed in each transistor capable of adjusting the threshold voltage $V_{th}$.

Based on the gate voltage, the drain current, and the substrate current detected by the detection processing unit 90, the determination processing unit 92 determines whether or not the threshold voltage $V_{th}$ that changes according to the electrical charge accumulated in the charge accumulation layer has reached the target value as well as determines whether or not the total amount of electrical charge that has flown to the substrate has reached the upper limit value.

The controller 94 controls the constituent elements of the wireless communication device 8.

In this way, in the comparator 3, during a non-operational state in which the voltages applied to the transistors 40-1 and 40-2 in the input stage 72 are not compared, the threshold value of at least either the transistor 40-1 or the transistor 40-2 is kept variable. That enables achieving enhancement in the accuracy of the operations without difficulty. Meanwhile, the adjustment of the threshold value can be performed either according to the accumulation of the electrical charge in the charge accumulation layer or according to the removal of the electrical charge from the charge accumulation layer.

When the comparators 3 according to the embodiment are large in number in a single chip such as in the AD converter 2 of the parallel comparison type, the effect is more noticeable. However, it is also possible to have a single comparator 3 in a single chip. Moreover, in the comparator 3, the voltage output by the output stage 70 changes within the range that is close to the voltage difference between GND and the power-supply voltage. That is, the comparator 3 has a gain. Furthermore, in the comparator 3, a gain stage can be further disposed in between the input stage 72 and the output stage 70 for the purpose of generating more gain. Hence, the comparator 3 can be used as a comparator (1-bit AD converter) or an amplifier constituting an AD converter of the pipeline type or the cyclic type. Besides, the comparator 3 can be used in an AD converter of the successive comparison type or the ΔΣ type.

As described above, the embodiment can achieve enhancement in the accuracy of operations without difficulty.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A comparator comprising:
a first transistor configured to operate when a first voltage applied thereto exceeds a first threshold value, the first transistor being disposed in an input stage;
a second transistor configured to operate when a second voltage applied thereto exceeds a second threshold value, the second transistor being disposed in the input stage;
an output stage configured to perform voltage switching and output according to a change in magnitude relationship between the first voltage and the second voltage;
a node group configured to, during a non-operational state in which the first voltage and the second voltage are not compared, vary at least either the first threshold value or the second threshold value; and
a threshold value adjuster configured to, when the absolute value of potential difference between the first voltage and the second voltage becomes equal to or smaller than a first setting value, apply voltages to the node group such that voltage value output by the output stage becomes equal to or smaller than a predetermined second setting value to adjust at least either the first threshold value or the second threshold value.

2. The comparator according to claim 1, wherein the threshold value adjuster accumulates electrical charge in a charge accumulation layer included in at least either the first transistor or the second transistor to adjust at least either the first threshold value or the second threshold value.

3. A wireless communication device comprising the comparator according to claim 1.

4. An AD converter having resolution of a plurality of bits, and comprising at least one comparator according to claim 1.

5. A wireless communication device comprising the AD converter according to claim 4.

6. An AD converter of parallel comparison type comprising:
a plurality of comparators configured to perform AD conversion by encoding a result of a parallel operation of the comparators,
wherein each of the comparators includes
a first transistor disposed in an input stage,
a second transistor disposed in the input stage,
an output stage configured to perform voltage switching and output based on an operation of the first transistor and the second transistor,
a node group configured to, during a non-operational state of the first transistor and the second transistor, vary at least either a threshold value of the first transistor or a threshold value of the second transistor, and
a threshold value adjuster configured to apply a voltage to the node group of each of the comparators to perform adjustment in such a way that the threshold value of the first transistor in each of the comparators or the threshold value of the second transistor in each of the comparators sequentially differs at regular intervals.

7. The AD converter according to claim 6, wherein the first transistor and the second transistor in each of the comparators are connected to have an identical voltage at a gate thereof.

8. The AD converter according to claim 6, wherein the first transistor of the comparators is connected to have a first voltage applied to a gate thereof, and the second transistor of the comparators is connected to have a second voltage applied to a gate thereof.

9. A wireless communication device comprising the AD converter according to claim 6.

* * * * *